(12) United States Patent
Bollinger et al.

(10) Patent No.: US 7,365,019 B2
(45) Date of Patent: Apr. 29, 2008

(54) ATMOSPHERIC PROCESS AND SYSTEM FOR CONTROLLED AND RAPID REMOVAL OF POLYMERS FROM HIGH ASPECT RATIO HOLES

(75) Inventors: Lynn David Bollinger, Ridgefield, CT (US); Iskander Tokmouline, New Fairfield, CT (US)

(73) Assignee: Jetek, LLC, Ridgefield, CT (US)

( * ) Notice: Subject to any disclaimer, the term of this patent is extended or adjusted under 35 U.S.C. 154(b) by 62 days.

(21) Appl. No.: 11/203,524

(22) Filed: Aug. 12, 2005
(Under 37 CFR 1.47)

(65) Prior Publication Data
US 2006/0076316 A1   Apr. 13, 2006

Related U.S. Application Data

(63) Continuation-in-part of application No. 10/359,326, filed on Feb. 6, 2003, now Pat. No. 6,955,991.

(51) Int. Cl.
   *H01L 21/306* (2006.01)
(52) U.S. Cl. ........................ 438/725; 438/716
(58) Field of Classification Search ............ 438/710, 438/715, 725, 729, 730, 795, 712, 716; 216/58, 216/59, 63, 67, 81, 492.2; 250/492.2
   See application file for complete search history.

(56) References Cited

U.S. PATENT DOCUMENTS

| | | | |
|---|---|---|---|
| 4,783,695 A | | 11/1988 | Eichelberger et al. |
| 5,153,408 A | * | 10/1992 | Handford et al. ...... 219/121.64 |
| 5,288,007 A | * | 2/1994 | Interrante et al. ........... 228/119 |
| 5,302,547 A | | 4/1994 | Wojnarowski et al. |
| 5,314,709 A | | 5/1994 | Doany et al. |
| 5,401,687 A | * | 3/1995 | Cole et al. .................. 438/125 |
| 5,808,270 A | * | 9/1998 | Marantz et al. ........ 219/121.47 |
| 5,830,376 A | | 11/1998 | Bohlke et al. |
| 5,938,944 A | * | 8/1999 | Baughman et al. ...... 219/76.16 |
| 5,968,283 A | | 10/1999 | Walraven et al. |
| 6,040,546 A | * | 3/2000 | Sorkin ................... 219/121.39 |
| 6,158,648 A | | 12/2000 | Mori et al. |
| 6,468,917 B1 | * | 10/2002 | Li et al. ..................... 438/712 |

(Continued)

FOREIGN PATENT DOCUMENTS

JP            61059834            3/1986

(Continued)

OTHER PUBLICATIONS

PCT International Search Report mailed on Nov. 28, 2000 for copending International Patent Application PCT/US00/27113.

(Continued)

*Primary Examiner*—M. Wilczewski
(74) *Attorney, Agent, or Firm*—St. Onge Steward Johnston & Reens LLC (57) ABSTRACT

A system that generates an intense hot gas stream is described to etch a polymer on a substrate used in the manufacture of semiconductor and MEMS devices with no surface damage. The etching process is particularly useful to remove a polymer from relatively high aspect Height-to-Width and Width-to-Height ratio holes that can include trenches, having relatively large aspect ratios for removal of polymers used in connection with the manufacturing of microstructures.

28 Claims, 6 Drawing Sheets

U.S. PATENT DOCUMENTS 6,568,329 B1    5/2003  Robinson
2004/0089632 A1*  5/2004  Park et al. .................... 216/71

FOREIGN PATENT DOCUMENTS

| JP | 9-246252 A | 9/1997 |
| WO | WO 97/45856 | 12/1997 |
| WO | WO97/46056 | 12/1997 |

OTHER PUBLICATIONS

Supplementary European Search Report, May 18, 2007, 2 pages.

* cited by examiner

FIG. 9c

ATMOSPHERIC PROCESS AND SYSTEM FOR CONTROLLED AND RAPID REMOVAL OF POLYMERS FROM HIGH ASPECT RATIO HOLES

PRIOR APPLICATIONS

This application is a Continuation-In-Part of and claims the benefit of the filing date of application Ser. No. 10/359, 326, Filed Feb. 6, 2003 now U.S. Pat. No. 6,955,991, which claims the benefit of the filing date of U.S. Pat. No. 6,762, 136 issued Jul. 13, 2004, which claims priority based on International Patent Application PCT/US00/27113 having an international filing date of Sep. 28, 2000, published Apr. 5, 2001 as WO 01/23130 A1 and Application Ser. No. 60/162,762 filed Nov. 1, 1999.

FIELD OF THE INVENTION

This invention relates generally to manufacturing of micro-structures for use in Micro-Electro-Machined Structures and semiconductor devices and more specifically to a manufacturing process using a hot gas stream technique to remove polymers.

BACKGROUND OF THE INVENTION

Holes and trench like patterns with a very high depth to width aspect ratio with micron or sub-micron openings have a number of applications in the manufacture of semiconductors. This description uses the term high aspect ratio holes to generically describe holes and trench like patterns that have a very high depth to width ratio of greater than 10 to 1. Various etching methods have been developed to generate such holes in silicon. The approaches use a lithographically defined mask pattern; wet chemical etch methods that take advantage of chemical selectivity along the crystal plane; and dry, plasma etch processes, which are done at low pressure to obtain a highly directional, anisotropic etch.

Very high aspect ratio holes have an application in semiconductor devices and in various Micro-Electro-Mechanical Structures (MEMS). In semiconductor DRAM devices trenches for high capacitance structures with low surface area having aspect ratios of 50:1 and higher are being investigated for advanced designs. For both semiconductor and MEMs devices, the need for subsequent patterning after making the very high aspect ratio holes usually requires a photolithographically defined mask pattern be made in a photosensitive polymer such as photoresist or photosensitive polyimide. In such a step, the high aspect ratio hole may be filled with the photosensitive polymer.

Following the processes that use the polymer mask pattern, the polymer mask must be stripped from the device. In some applications, it may be advantageous to remove the polymer material partially, to a controlled depth to allow processing the upper, exposed section of the hole while the remaining polymer protects the lower section in the hole. A DRAM capacitor application that uses such a capability to increase the capacitor's area is described in "New Materials Enhance Memory Performance" a review by J. Baliga, Semiconductor International, November 1999, p 79-90, see p. 80.

Particularly for semiconductor applications, an additional requirement of the polymer removal process is that the exposed surface of the device not be subject to electrical degradation. Types of degradation that can occur in plasma removal processes may come from energetic species as later described causing crystal damage or damage to a thin dielectric layer, partial removal of an underlying target layer, and heat damage to in-place layers.

Standard methods of removing photo-polymers involve a method referred to as "ashing" in which a low pressure electrical discharge generates a plasma that creates chemically reactive oxygen species that flow to the surface to strip off the polymer and convert the polymer to volatile oxide by-products (e.g., $HO_x$, $CO_x$). For very high aspect ratio holes, the flux of active oxygen species, that reaches the bottom of the hole, decreases as the aspect ratio increases, with the result that the etch rate of the polymer slows dramatically. One means to avoid this is to use a High Density Plasma (HDP). In this process, an intense plasma is generated at a low pressure. This pressure is sufficiently low so that the path length between collisions of plasma generated reactive species is sufficiently long so that reactive ions can be injected into the hole by acceleration of an electric field set-up in a boundary layer "sheath" over the surface of the substrate. A problem with this HDP approach is that the energetic ion species can electrically degrade the device's electrical characteristics and a problem with all conventional plasma and wet chemical processes for holes having aspect ratios greater than 10:1, the etch rate significantly slows.

The prior art has used the concept of a long path length between collisions with other gas species to enable a reactive species to reach the bottom of a very high aspect ratio hole where the species can convert the polymer to volatile by-products.

Devices are now being fabricated for a growing number of applications that have dimensions in the micron and nanometer dimension range. For example, very small dimension sizes are utilized in advanced microelectronic IC logic and memory devices. A growing number of applications for miniaturized devices, referred to as Micro-Electro-Mechanical Structures (MEMS), such as micro-sensors and micro-positioners have been commercialized. Lithography developed for microelectronics production has readily been transferred to MEMS production, for defining a mask pattern from which the pattern can be transferred into a substrate material (e.g., silicon wafer) in a subsequent etch step. Any number of substrate materials may be used to make MEMS devices. Single crystal silicon is most commonly used for fabrication of MEMS as processes developed for manufacture of semiconductor devices can be transferred to MEMS production. Fabrication processes are now well established to form structures by etching very deep, straight walled structures into a substrate in which the orientation of the crystal structure is used to give a very high directionality to the etch.

However, limitations arise in fabricating free standing structures, multiple levels of such structures and in general not damaging relatively fragile, in-place device elements by other processes needed to complete fabrication of the integrated device. Methods to solve these limitations are needed to expand the application base while continuing to shrink the size of microstructures.

Conventional wet chemical and low pressure plasma removal processes designed for photoresist removal are unable to remove polymer from holes and trenches that have a very high depth to width aspect ration without damaging the surface of the device. Generally, conventional processes are unable to fully remove polymer from surfaces that have complex topologies and that may include over hanging device elements. Additionally, these processes cannot practically remove highly cross-linked polymers such as polyimide that can withstand elevated temperatures as needed for some manufacturing steps.

What is desired then is a method that will remove a polymer used to fabricate free standing microstructures for MEMS and semiconductor devices.

It is further desired to provide a method for removing a polymer from under device elements having relatively high depth to width aspect ratios and relatively high width to depth aspect ratios.

It is also desired to provide a method for removing a polymer used to fabricate free standing microstructures that will not damage the relatively fragile microstructures.

It is still further desired to provide a method for removing a polymer in a non-directional or fully isotropic manner.

It is further desired to provide a method for removing a polymer used to fabricate free standing microstructures that will remove the polymer at a relatively rapid rate.

It is yet further desires to provide a system and method for removing a polymer used to fabricate free standing microstructures that will remove highly cross-linked polymers, such as but not limited to polyimide.

It is also desired to provide a product having microstructures for MEMS and semiconductor devices that include relatively high depth to width aspect ratios and relatively high width to depth aspect ratios.

SUMMARY OF THE INVENTION

In our invention we describe the use of a near atmospheric pressure process that enables removal of a polymer from high aspect ratio holes, including trenches, without electrical degradation. These holes in substrates may have depth to width ratios greater than 10:1 including very narrow widths that can be less than 0.1 micron. With this invention a controlled, partial removal of the polymer from high aspect ratio holes can be done without electrical degradation of sensitive devices that may be on the substrate. The polymers may be removed at relatively high rates, >5 microns/min. The polymers may be standard, photoresists or highly cross-linked polymers such as polyimide that are very difficult to remove by any standard wet or dry plasma techniques.

In one advantageous embodiment of the invention, a system and method are provided enabling the production of microstructures that have free standing device elements, which for example, may include elements that are not embedded in or lying on other materials of the device. An important aspect of the present invention is the method by which polymers may be effectively removed from devices having very deep, very narrow holes, trenches and/or otherwise very severe and complex topology such as for example, very wide and very shallow holes underlying a structure, while at the same time leaving these free standing structures undamaged by the removal process.

This is achieved with one technique according to the invention with the use of a system for generating a near atmospheric flow of a hot gas stream to the wafer substrate surface from which polymer is to be removed from high aspect ratio holes. The hot gas stream typically has a smaller area than the substrate so that controlled motion of the substrate through the hot gas stream is used to uniformly remove polymer from the substrate. The hot gas stream is formed by a high temperature arc type plasma that is generated in an inert gas such as argon. The combined effect of ashing, i.e. the reaction of oxygen with the polymer to form volatile products, and ablation, discussed further in the following specification, enable a controlled removal of the polymer from high aspect ratio holes.

A patterned material may be constructed on a polymer layer that overlays a partially constructed microstructure, where the polymer may be later fully removed using a hot gas process to leave a free standing pattern. Fragile elements of a partially constructed microstructure may be protected by a hot gas removable polymer to allow fabrication steps that would otherwise damage the unprotected device elements. In this manner, fabrication of three-dimensional structures is possible. For the polymer removal process, the following requirements are desirable, polymer removal: 1) from holes having diverse depth to width ratios; 2) without damaging in-place device elements; 3) with a non-directional, highly isotropic process; 4) of mechanically rigid polymers and can withstand relatively high temperatures (e.g. 400° C.), such as polyimide, as may be needed to form the structure elements; and 5) at relatively high rates to make production processes commercially cost effective.

The polymer removal process is an atmospheric process carried out in a controlled environment. The substrate is exposed to for example, an upward flowing, hot gas stream. The hot gas stream will have a temperature in the range of 4000° C. to 12,000° C. with a diameter of several centimeters. Typically, the hot gas treatment area is smaller than the substrate, which is fully treated by multiple scans through the hot gas treatment area. Systems that use for example but are not limited to, both a planetary type scan configuration and/or a step and scan configuration, may be used for hot gas processing.

In one advantageous embodiment, a method for making micro-structures in a substrate is provided comprising the steps of using a polymer to protect or support the microstructures during fabrication. The method further comprises the steps of removing the polymer after completion of fabrication by generating and directing a hot gas stream at the substrate containing the micro-structure devices.

In another advantageous embodiment, a method for removing a polymer from a substrate having micro-structures that are filled with a polymer is provided, comprising the steps of directing an atmospheric hot gas stream having a heat flux in the range from about $10^6$ to $10^8$ W/m$^2$ for a controlled rapid removal of a polymer from the micro-structures in the substrate. The method further comprises the steps of varying the position on the substrate that is exposed to the hot gas to obtain a substantially uniform removal of polymer material from the micro-structures in the substrate.

In still another advantageous embodiment, a method is provided for removing a polymer from a substrate having micro-structures that are filled with a polymer, the micro-structures having depth-width (D-W) or width-depth (W-D) aspect ratios of greater than 10 to 1, comprising the steps of directing a hot gas stream at the substrate containing the micro-structure devices having D-W or W-D aspect ratios of greater than 10 to 1. The method further comprises the steps of removing the polymer from the micro-structure devices having D-W or W-D aspect ratios of greater than 10 to 1.

In yet another advantageous embodiment, a substrate having micro-structure devices having at least one depth-to-width (D-W) or width-to-depth (W-D) aspect ratio hole in which a polymer has been removed is provided, according to the following process directing a hot gas stream at the substrate containing the micro-structure devices having the D-W or W-D aspect ratio hole of greater than 10 to 1. The process further comprises removing the polymer from the micro-structure devices having the D-W or W-D aspect ratio hole of greater than 10 to 1.

DETAILED DESCRIPTION OF THE DRAWINGS

Figure 1:
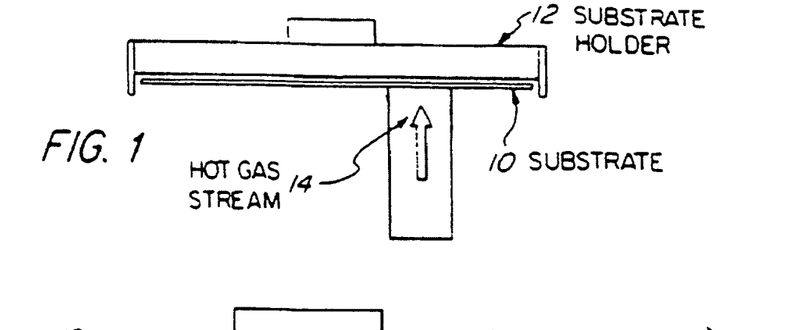
FIG. 1 is a schematic side plan view of an apparatus showing the concept of using a hot gas stream for the removal or controlled partial removal of a polymer in accordance with the invention from high aspect ratio holes in a substrate surface.
Figure 2:
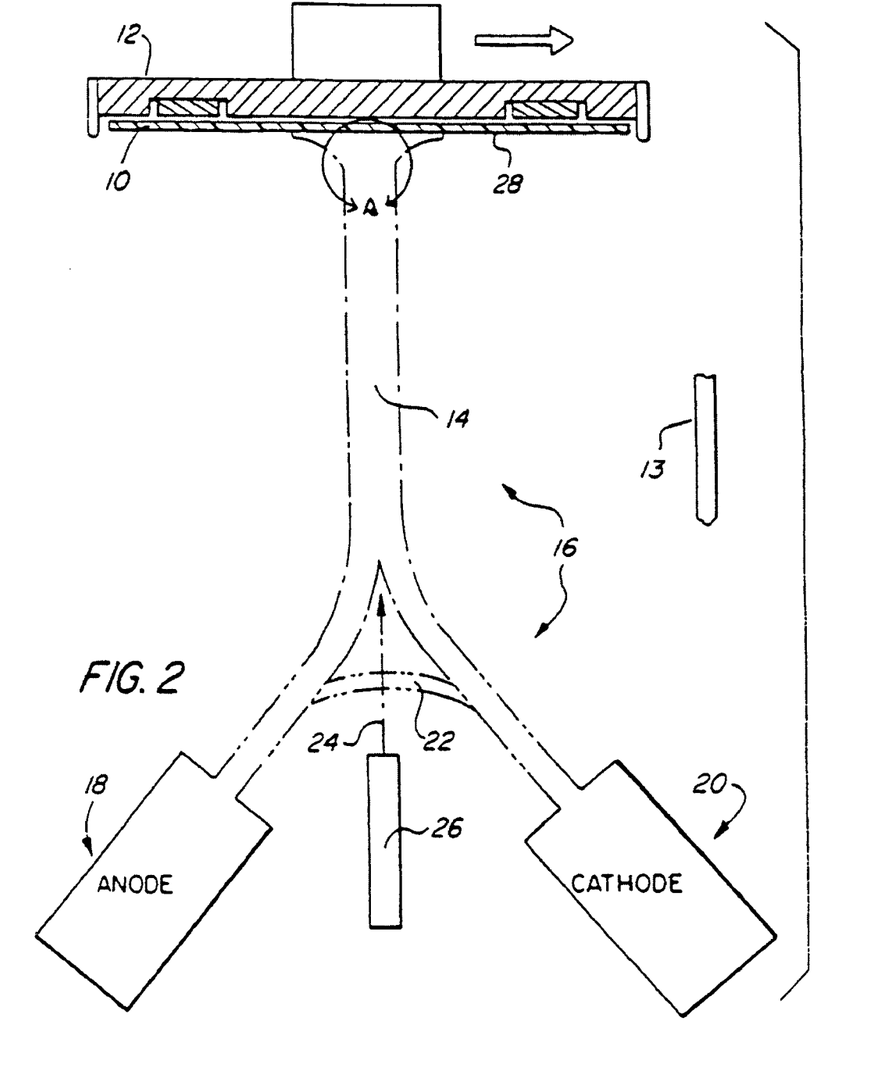
FIG. 2 is a schematic side plan view of a plasma processing system that can be used to generate the needed hot gas stream.

With reference to FIGS. 1 and 2 a semiconductor wafer 10 is shown mounted on a wafer holder 12. A hot gas stream 14 is directed onto the substrate or wafer surface. The wafer 10 is held in an upside down position with the assistance of a negative pressure from a flow of gas such as nitrogen. The wafer holder 12 and technique for retaining a wafer can be as described in U.S. Pat. No. 6,467,297 B1 entitled "Wafer Holder For Rotating and Translating Wafers For Processing In An Atmospheric plasma System With Control Of Wafer Holder Temperature" having an issue date of Oct. 22, 2002 by the same inventors and owner as for this patent application and which is fully incorporated herein by reference thereto.

With reference to FIG. 2, an atmospheric hot gas stream 14 is generated with an apparatus 16 within a sealed chamber 13. The atmospheric plasma generating system 16, often referred to as a plasma jet, has previously been described, see U.S. Pat. No. 6,040,548, by Siniaguine, entitled "Apparatus for generating and deflecting a plasma jet". Additional improvements to the apparatus described in U.S. Pat. No. 6,040,548 for this polymer removal application are described and referenced in the description of this application.

The apparatus 16 uses a high temperature, arc type plasma generated in an inert gas such as argon between two electrode subassemblies 18, 20 that serve as a cathode and anode. An arc discharge 22 is shown for illustrative purposes only to show flow of current between the two electrode subassemblies 18, 20. As shown in FIG. 2, the arc 22 formed by the electrode configuration creates the stream 14 of hot gas to the substrate surface 28. The substrate or wafer 10 to be processed is moved through the treatment area formed by the hot gas stream 14 using a suitable actuator that is not shown. Other suitable ambient gases may be employed inside the sealed chamber 13.

A gas injector 26 may be used to inject a gas such as oxygen or a mixture of gasses directly into the hot gas stream. Without a flow of gas from the gas injector 26, the hot gas stream is composed primarily of the inert gas from the two electrode assemblies and from the process chamber 13 ambient gas that is entrained into the hot gas stream. For a polymer removal process, the temperature of the gas stream at the hydrodynamic gas boundary over the wafer surface 28 may typically be about 8,000° C. This temperature may be controlled by controlling the distance of the electrode assemblies 18, 20 from the substrate 10 and the power into the arc type plasma. Typical power parameters for driving the arc plasma may be for example, approximately 150 V and 80 A.

The size of the treatment area generally denoted as A, where the stream 14 is incident upon the substrate surface 28, is for example, approximately 2 cm diameter, normally less than the size of the substrate 10 to be processed (e.g., a 200 mm diameter silicon wafer). Consequently, the entire substrate surface 28 is treated by multiple passes of the wafer 10 through the treatment area using a motion configuration that provides for treatment over the full wafer area.

The inventors have used motion configurations that are referred to as step and scan, and by way of rotation of the wafer 10 about its center and translation of the wafer center, referred to as planetary motion. The wafer holder 12, which may comprise for example, 200 mm diameter wafers, holds the wafer 10 facing downward. In the step and scan configuration, the scan velocity determines the exposure time of any area of the wafer 10 to the hot gas stream 14. In the step and scan embodiment, the scan velocity is provided by mounting the wafer holder 12 on an arm that moves the wafer holder 12 and wafer 10 in a circular motion. The programmable velocity of the circular motion determines the exposure time of any area on the wafer to the hot gas stream. The center of the circular motion is linearly stepped to give the step and scan motion.

In a planetary motion embodiment, the wafer 10 is rotated about its center by a rotating wafer holder 12; the center of the wafer 10 and wafer holder 12 are mounted on an arm that revolves the wafer center in programmable circular motion. For this motion configuration, the exposure time of any area of the wafer 10 to the hot gas stream 14 is determined by the combined velocities of the wafer rotation and translational velocity of revolution.

The process may be controlled by the time any area of the substrate 10 is exposed to the hot gas treatment area A, by the heat flux delivered by the hot gas stream 14, and the composition of the hot gas stream 14. The depth of polymer removed from a local area of a substrate as it passes through the hot gas stream 14 depends on the time that the area spends in the hot gas stream and, consequently, on the velocity of that local area through the gas stream 14. For example, if a rotation and translation motion configuration is used with a constant rotational velocity, a local area of the wafer has a rotational velocity that increases with radial distance R from the center of rotation. To achieve uniform polymer removal over the full substrate 10, the translation velocity of the substrate 10 through the hot gas stream 14 must then be a function of distance from the center of rotation to account for this increase in radial velocity. To a first approximation, the translation velocity will have a 1/R dependence. In practice, the programmed velocity may be adjusted in an iterative procedure based on a measurement after a partial polymer removal that gives a mapping of the variation of the thickness of the polymer removed from uniform removal. The local velocity of the substrate 10 through the hot gas stream is then adjusted to compensate for the measured thickness variation. A procedure for iteratively adjusting the velocity for a treating a batch of wafers using planetary motion configuration is described in the international patent WO9745856 entitled "Method for treating articles in a plasma jet," inventors Tokmouline and Siniaguine.

As described in the above paragraph, the depth of polymer removed from a local area as it moves through the hot gas stream 14 depends on the velocity of the local area through the hot gas stream 14. Velocities may be in a preferred range of, for example, 0.01 to 10 meters/sec. An example of a polymer removal process would be for a 200 mm diameter wafer with a rotation and translation motion configuration in which the time averaged polymer removal rate is 5 microns/min and the average translation velocity of a pass through the hot gas stream is 0.5 m/sec. In one advantageous embodiment, where a planetary type motion configuration of the wafer through the hot gas stream is used, we refer to a pass as a single motion of the full wafer through the stream treatment area; the combination of the wafer's rotation and translation exposes the full wafer to the treatment area in a single pass. The time of a pass through the hot gas stream 14, including the time the substrate 10 spends out of the hot gas stream, would be approximately 0.5 sec. In a single pass 0.042 microns of polymer would be removed. To remove 2 microns of polymer, 48 passes would be needed. The number of passes of the substrate 10 through the hot gas stream 14 can then be used to control the depth of the polymer removed. In the above example, 0.5 microns would be removed with 12 passes. In practice, when polymer is removed from very narrow, very high aspect ratio holes there may be a dependence of removal rate with depth into the hole. This dependence can be measured and compensated for by adjusting the number of passes. Since the removal rate per pass is averaged over a full 200 mm wafer, the instantaneous removal rate over the approximate 2 cm diameter of the treatment area is much larger, approximately 630 microns/min.

To measure the removal rate of photoresist from very high aspect ratio trenches, 200 mm diameter silicon wafers starting wafers were used that had sets of trenches 0.6 microns wide and 3 microns deep (depth to width aspect ratio ~50:1); the trenches were filled with photoresist and an additional 0.5 micron thick uniform blanket photoresist covered the full wafer. The blanket photoresist was observed to be removed in 12 passes for a removal rate of 5 microns/min. The rate of photoresist removal in the trenches was measured by exposing the photoresist filled trenches to different numbers of passes through the hot gas stream. After the hot gas removal, the wafer was cross-sectioned through a set of trenches by cleaving the wafer along a crystal plane that intersected the trenches. Pictures of the cross-sectioned wafers were taken in a Scanning Electron Microscope (SEM) and the depth of photoresist removal in the trenches measured from the SEM picture. In one example, a wafer was exposed to 112 passes through the hot gas stream (100 passes after removal of the blanket layer) to remove 2.5 microns of phtoresist from the hole. The removal rate as a function of depth of removal in the trench could then be measured. The removal rate in the trenches was measured to be 3 microns/min and within experimental error remarkably constant from top to bottom of the trench.

Two fundamental differences between our atmospheric process, and, the prior art ashing and HDP processes are: (1) the gas temperature is high and in thermal equilibrium in the etching gas stream; and (2) the arc generated plasma and process gas stream are highly collision dominated. In the prior art low pressure plasma applications, the atomic and molecular species are near room temperature (e.g., 100° C.) while the electrons are very energetic (e.g., 5 eV, ~50,000° K.). In the gas stream 14 of an atmospheric system 16 in accordance with the invention as shown in FIGS. 1 and 2, the atomic and molecular species are in thermal equilibrium with the electrons with the gas stream temperature being in the range of 4000° C. to 12,000° C. and preferably in the range of 7,000° to 10,000° C.

One important aspect of the hot gas removal process is that the device surface from which the polymer is being removed is not exposed to the very high temperature gas of the hot gas stream, rather the temperature of the gas at the substrate surface is near that of the substrate itself. This is because being an atmospheric pressure process that is highly collision dominated, the hot gas stream flowing onto the surface of the substrate forms a hydrodynamic gas boundary layer within the region A over the substrate surface; the thickness of the boundary layer is approximately 100 microns. There can be a large temperature differential across the boundary. For example, on the gas streamside the gas temperature may be 8,000° C. while the wafer temperature may only be 100° C. The temperature of the gas then drops over the boundary layer from the hot gas temperature to a temperature very near that of the substrate at the surface of the substrate. Consequently, elements on the substrate surface, whose height above the surface are small compared to the width of the boundary layer, can be prevented from exposure to gas temperatures that could be damaging. For example, with commonly used photoresists, the photoresist pattern will flow at temperatures >150° C. and the photoresist will darken near 200° C. If the photoresist pattern is partially removed with this hot gas process, examination of the partially removed resist shows no flow of the pattern indicating a temperature <150° C.

Known hydrodynamic boundary layer characteristics applied to this application and described in the following paragraphs show, that while the gas temperature defined by the atoms and ions drop to the substrate temperature at the surface of the substrate (e.g., 100° C.), the electrons can maintain considerably more energy at the substrate surface (e.g., 0.7 eV or ~6,000° C.). With this energy the electrons can locally generate species at the substrate that will contribute to etching in deep holes.

The temperature of the heavy species, primarily atoms and ions of mass $M_{atom}$, decrease smoothly from the temperature of the incoming gas flow (e.g., 8000° C.) down to the substrate surface temperature (e.g., 100° C.). The boundary layer thickness $\delta$, is $\delta \sim 10^{-4}$ m and the boundary thickness over which the significant part of the temperature change occurs is $0.01\delta \sim 10^{-6}$ m. Compared to collisions between heavy species, electrons, because of their relatively light mass $M_e$, transfer only a small part of their kinetic energy per collision with a heavy species, a factor of $M_e/M_{atom} \sim 10^{-5}$. Consequently, over such a small distance, electrons cannot transfer a major part of their energy while traversing the boundary layer.

Damage mechanisms from material removal processes that are well know to MEMS and microelectronic fabrication are: thermal damage; electronic damage; and removal of substrate materials other than those being targeted.

Evaluations of the devices that are very sensitive to electrical damage were made after exposure to the hot gas polymer removal process. No electrical damage effects were detected with these measurements. The devices had very thin gate dielectrics with a large antenna-like pattern connected to a gate conductor. Capacitance/Voltage (CV) characteristics of the gate before and after processing showed no change. There is no electrical damage because: 1) the hot gas stream is not a plasma and electrical charging of the substrate does not occur; and 2) being at atmospheric pressure, the gas atom motions are collision dominated and cannot develop damaging energies.

In the hot gas removal process, preferably inert gasses such as argon and oxygen are used, the mechanisms of ashing with monatomic oxygen and ablation give a high removal rate of polymers but have no etch mechanism for non-polymers. After a long exposure of thin non-polymer layers, such as the commonly used microelectronic materials of silicon dioxide, silicon and aluminum, to the hot gas polymer removal process, the measured thickness of these thin layers showed no detectable removal.

For polymer removal applications, the stream 14 of hot gas to the substrate that is generated by an atmospheric plasma consists of inert gas from the arc and process chamber ambient gas pulled or entrained into the stream and, optionally, gas injected directly into the hot gas stream by a gas injector 26. The stream of hot gas to the substrate can remove the polymer by two mechanisms:

1. An ashing mechanism in which thermally created active oxygen species react with the polymer to form volatile by-products. The ashing mechanism is similar to low pressure plasma strippers in that monatomic oxygen chemically reacts with the polymer to form volatile compounds (e.g. OH, $H_2O$, CO, $CO_2$) which are removed from the system.

2. An ablation mechanism in which the flow of hot gas to the substrate surface 28 vaporizes clusters of molecules from the polymer surface which are subsequently converted to volatile by-products by reaction with the ambient oxygen in the process chamber 13 surrounding the apparatus 16. The ablation process is an interaction with the top monolayers of the polymer layer and it can carry away a significant amount of heat from the polymer surface 28 so that the remaining polymer layer is not thermally degraded. The clusters are reacted into gaseous molecules away from the surface and removed from the system.

In comparison to other polymer removal processes, delivery of a high heat flux delivered to the substrate surface is unique to the hot gas process and consequently, so is the ablation mechanism. The above two mechanisms act in synergism. The heat flux to the surface may accelerate the ashing mechanism and the heat generated by the ashing mechanism tends to accelerate ablation.

Non-directional, or fully isotropic, polymer removal provides for lateral as well as vertical polymer removal enabling complete removal from under structure elements. Three interrelated effects result in the hot gas polymer removal rate being fully isotropic.

1. A result of the hydrodynamic boundary layer is that there is no directed flow of the gas at the substrate surface. Heat is transferred to the substrate by the high temperature gradient; reactive species (e.g., monatomic oxygen) diffuses to the surface driven by the high concentration gradient. There is then no directionality imparted to the removal as a result of gas flow.

2. The hot gas removal process being at atmospheric pressure is highly collisional; the mean free path between gas atom collisions is very short, <1 micron. This randomizes any effects that could lead to a directionality in the local motions of the gas atoms.

3. The hot gas stream is not a plasma; the only ionization is due to thermal excitation and is therefore very low, $\sim 10^9$ $cm^{-3}$. This, in combination with the very short mean free path prevents formation of an electrical sheath at the substrate's surface across which ions could be accelerated to give a directionality to the process. For conventional low pressure plasma etching, the electrical potential across a sheath is used to drive directional etching as needed for forming device patterns.

Polymers that are highly cross-linked generally remain stable at relatively high temperatures. They are also mechanically more stable and relatively chemically inert. One such commercially available polymer is polyimide; it can be made stable up to temperatures of 450° C. compared to photoresist which starts to flow at 150° C. However the chemical inertness of polyimide makes it difficult to remove, precluding is use for many applications. Conventional plasma and wet chemical processes are unable to remove fully cross-linked polyimide at rates usable for a fabrication process. The hot gas polymer removal of this invention removes fully cured, highly cross-linked polyimide at rates >3 microns/min over a full 200 mm wafer without any degradation of the remaining polyimide. This also allows for a production process in which a highly cross-linked polymer is partially removed and then used for a foundation for constructing additional device elements as well as applications for complete polymer removal.

Polyimide removal rates were measured and found to be dependent on the temperature reached during the removal process. At approximately 200° C. polyimide removal rates were measured to be 3 microns/min and at approximately 350° C., 5 microns/min. Wafer temperatures were measured by putting commercially available temperature indication stickers with multiple temperature indicators that change color when a specified temperature is reached. Polyimide removal rates were measured by coating 200 mm wafers with a known thickness of fully cross-linked polyimide (with an oven cure) and measuring the amount of removal after a specified number of passes which corresponds to a process time. Thickness of the polyimide was measured by two methods: non-destructively with a color interferometer; and with a mechanical profilometer after scratching a step into the polyimide down to the underlying silicon.

Figure 3:
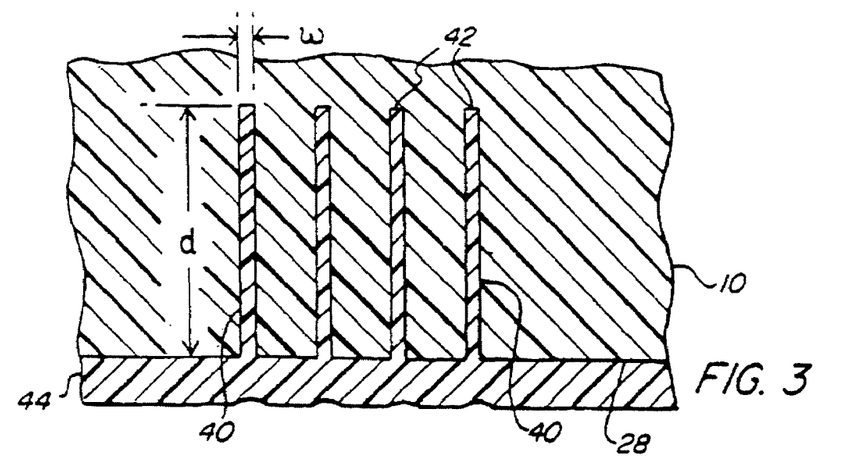
FIG. 3 is an enlarged section view of a semiconductor wafer substrate having high aspect ratio holes covered by a polymer during manufacture.

The atmospheric pressure approach for removal of polymers in high aspect ratio holes is particularly effective in comparison with conventional low pressure ashing and HDP processes, as described above. It is recognized that to remove polymer from very high aspect ratio holes as illustrated at 40 in FIGS. 3-5 the pressure must be sufficiently low for reactive species to reach the bottom 42 of the holes 40 without being affected by collisions with other atomic or molecular species. In an atmospheric hot gas technique in accordance with the invention, the transport of the etching species into the high aspect ratio hole is by way of a flow of collision dominated gas. Results show that the polymer 44 can be removed from trenches or holes 40 having a 50:1 aspect ratio, with a width w of less than 0.1 micron, with little effect on the etching rate of the polymer 44 even near the bottom 42 of the hole 40. Results show no limit as to obtaining similar control of polymer removal from even higher aspect ratio holes.

Figure 4:
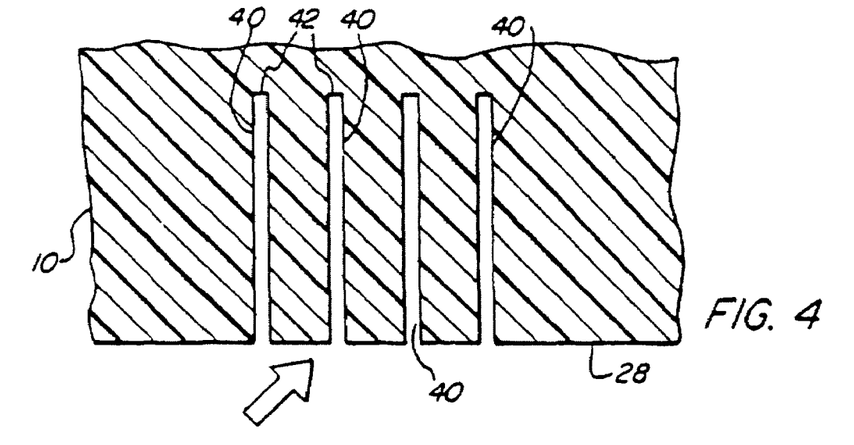
FIG. 4 is an enlarged section view of a semiconductor wafer substrate as in FIG. 3 with the polymer removed using a technique of the present invention.
Figure 5:
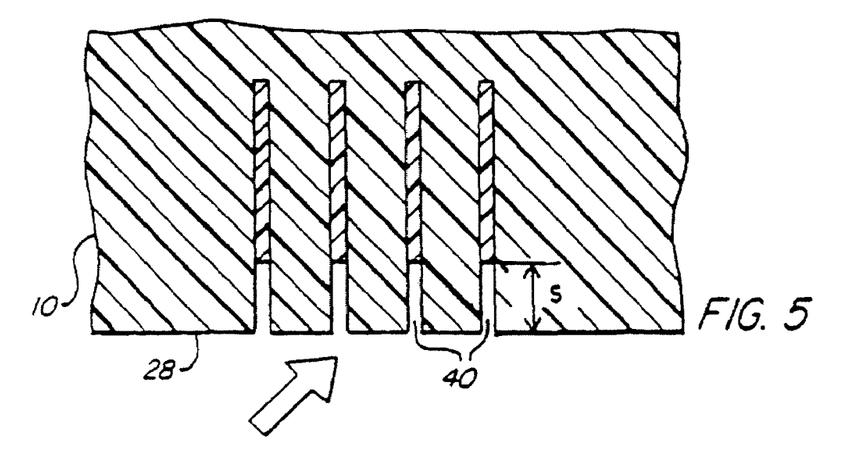
FIG. 5 is an enlarged section view of a semiconductor wafer substrate as in FIG. 3 but with the polymer partially removed using a technique of the present invention.

For the application of controlled removal of the polymer 44 from high aspect ratio holes 40 as shown in FIG. 4, the process of this invention must uniformly remove the photoresist 44 from the holes 40 to a controlled depth S as well as maintain a high etch rate so as not to drive up the process cost. Obtaining uniform removal of photoresist is further complicated by the temperature dependence of the etch rate. The etch rate for photoresist and other polymers increases with temperature. For applications of removal of polymer to a controlled depth, rather than a complete stripping of the polymer, temperature control and uniformity of removal are necessary.

The above identified U.S. Pat. No. 6,467,297 B1 describes a wafer holder and wafer motion configuration in which a rotating wafer is translated through the treatment area so that one can cause average wafer holder dependent thermal variations to be constant for a given radius. This provides axial symmetry to the temperature dependence. As described in U.S. Pat. No. 6,467,297 B1, programmed motion of the center axis of a rotating wafer is used to establish uniform treatment of the wafer. For the temperature dependent photoresist removal application, the programmed motion of the wafer is used to compensate for thermal etch rate effects. In addition, the 158,892 application describes the use of a direct fluid cooled wafer holder with temperature feed-back to maintain the wafer holder at a constant temperature during processing.

Figure 6A:
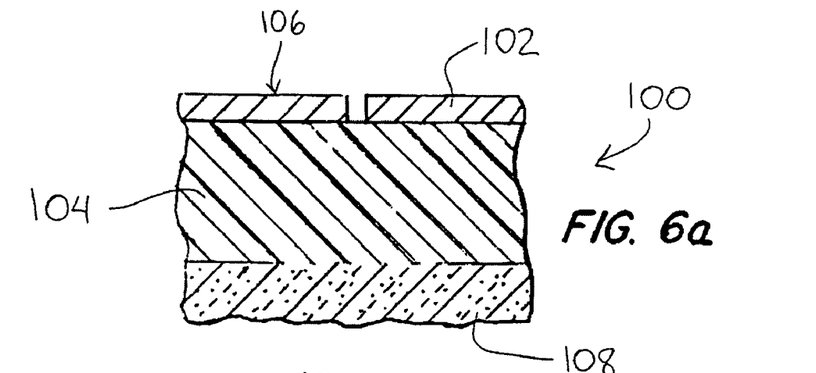
FIGS. 6A-6D are a representation illustrating the differences between non-directional, fully isotropic material removal and directional, anisotropic removal.
Figure 6B:
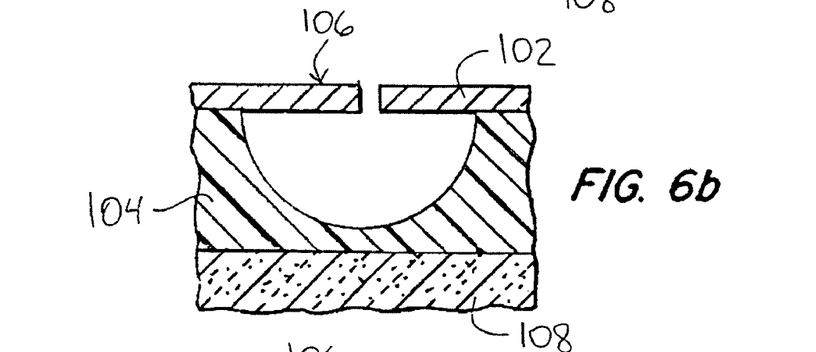
Figure 6C:
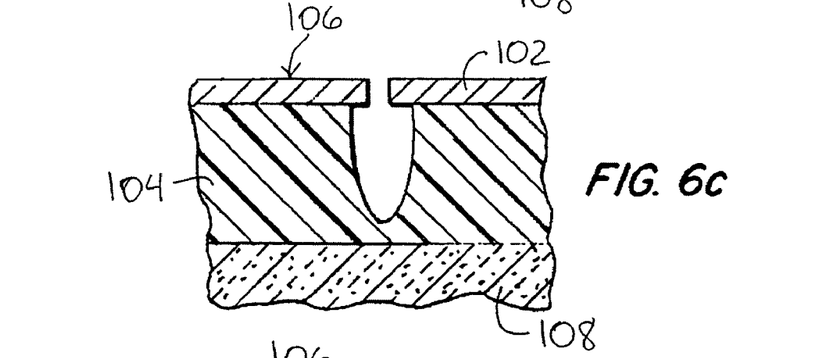
Figure 6D:
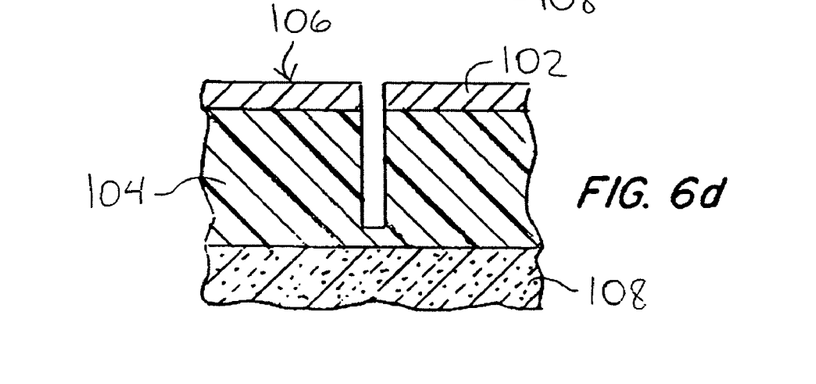

With reference to FIGS. 6A-6D and 8A-8C, the mechanism is shown by which the non-directional, isotropic polymer removal characteristic of the hot gas process fully removes polymer from under structures. FIGS. 6A-6D are cross-sectional views of a masking pattern with a hole through which exited and reactive species, from the hot gas stream, enter to react with the polymer to form gaseous by-products. FIG. 6A illustrates the device 100 including for example, an upper etch mask 106 and/or a device element 102, a polymer 104 and a sub-layer 108. FIG. 6B illustrates fully isotropic removal where the removal in the lateral direction is equal to the removal in the vertical direction. Consequently as shown in FIG. 6B, polymer 104 under device elements 102 may be completely removed to leave a free standing structure. If the depth of the polymer layer 104 is less than the lateral width of the device elements 102 and the removal reaches the sub-layer 108 before completely removing the polymer 104 from under the device element 102, the removal time can be extended (i.e., continue passes of the substrate through the hot gas stream) until the polymer 104 is completely removed with no etching into the sub-layer 108.

FIGS. 7A-7D and 9A-9C show examples of two classes of microstructure fabrication enabled by the use of a hot gas removable polymer. Dimensions of such structures are in the micron to sub-micron range.

The method by which "air structures" may be produced is shown in FIGS. 7A-7D. It can be desirable for MEMS and microelectronic devices to have supported, free standing elements such as a simple beam comprising a connective conductive element 110, which is connected to device element 102 via electrical conductors 112. These elements could be of more complex geometry to provide, for example, a spring action or a bi-metallic temperature sensor. Such structures are referred to as "air structures". The capability to construct such patterned elements on a flat surface is well known and extensively used in high volume semiconductor device production and typically involves the following steps: 1) the material for the device element is deposited uniformly on a surface; 2) the pattern for the device element is lithographically defined in photoresist mask over the deposited layer; 3) the deposited material is removed by a wet chemical or dry plasma etch process except where protected by the photoresist; and 4) the photoresist is removed leaving the patterned device element.

To generate an air structure, a connective conductive element 110 may be provided on a removable, supporting polymer 104 layer. Some deposition processes require an elevated temperature, such as for anneal of copper; and, some applications for multiple elements would need multiple photoresist strip operations on the support polymer 104. A highly cross-linked polymer 104 such as polyimide can serve this function. Polyimide can withstand temperatures of 450° C. without degradation and conventional photoresist removal methods may be used to remove a photoresist pattern without removing any of the supporting polyimide layer.

Figure 7A:
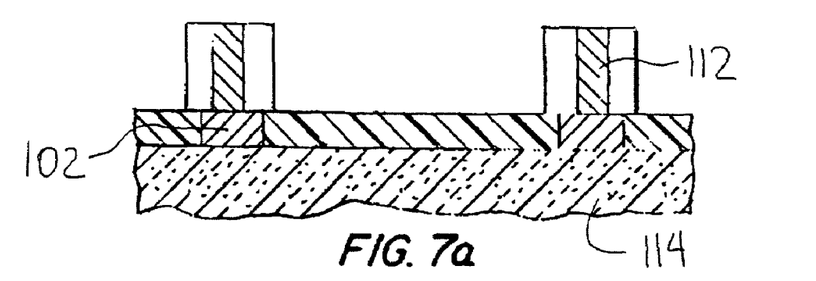
FIGS. 7A-7D are a representation of steps in make an air structure.
Figure 7B:
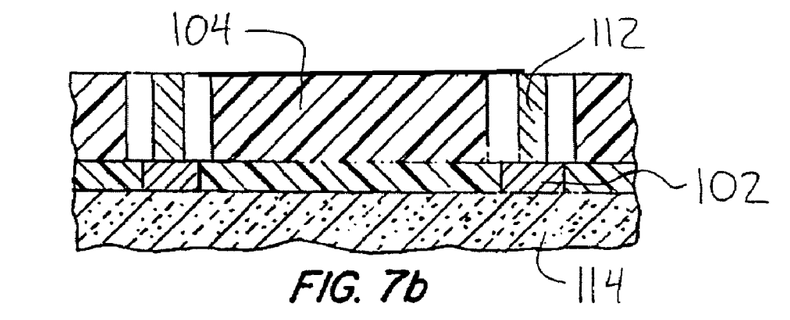
Figure 7C:
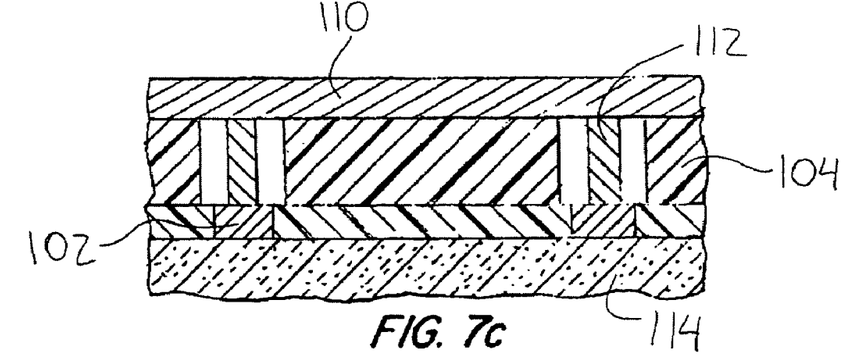
Figure 7D:
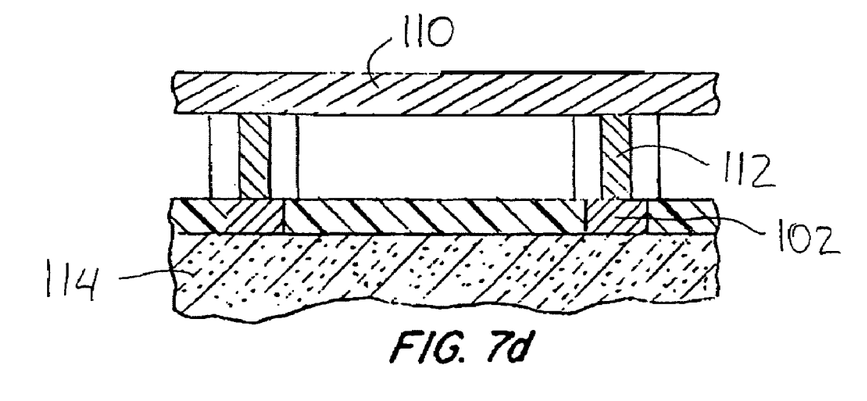

FIGS. 7A-7D illustrate a simple example of an air structure that is of use to advanced, high speed microelectronic devices. Interconnecting electrical conductors 110 between supports 112 and device elements 102 may comprise for example, copper, aluminum or gold, but may comprise any relatively highly conductive material. It is further contemplated that it is desirable for the insulating dielectric between the electric conductors 110 and other device elements to have a relatively low dielectric constant to reduce capacitive coupling of the interconnect with other conductive device elements. Air is one of the lowest dielectric materials (excluding vacuum) and hence it can be a device performance advantage for critical interconnect elements to be, for example, copper air structure "bridges." A polymer such as polyimide is deposited over a device element or structure 102 around conducting "plug" connections or electrical conductors or supports 112 to the underlying device element 102. The polymer 104 surface may be made flat and co-planar with the electrical conductors or supports 112 using an established process such as for example, chemi-mechanical polishing, as shown in FIG. 7B. A connective conductive element 110, which may comprise copper that connects to the electrical conductors or supports 112 is deposited onto the support polymer 104 as seen in FIG. 7C. The hot gas process is used to remove the polymer 104 leaving the copper air structure interconnect as illustrated in FIG. 7D.

Figure 8A:
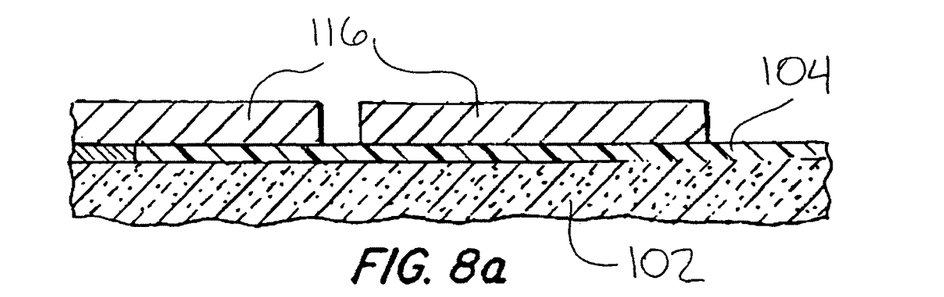
FIGS. 8A-8D are a representation illustrating how the hot gas process fully removes polymer from under structures.
Figure 8B:
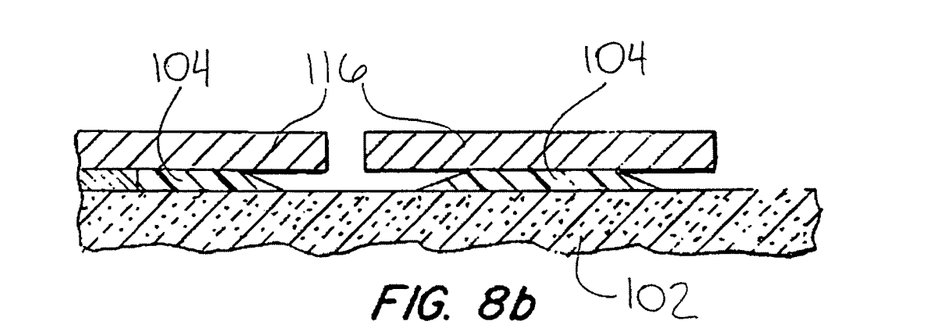
Figure 8C:
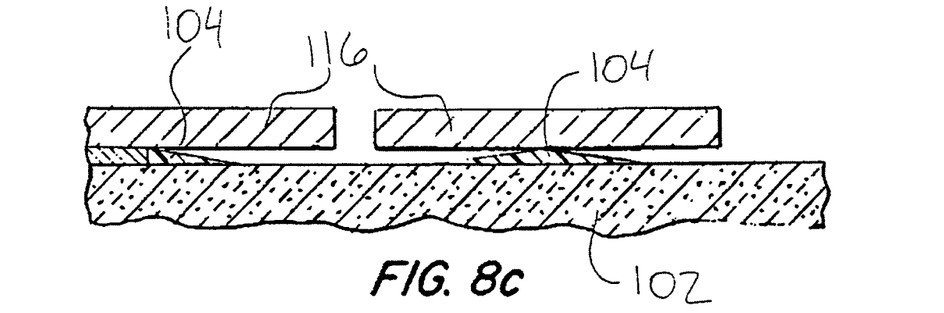
Figure 8D:
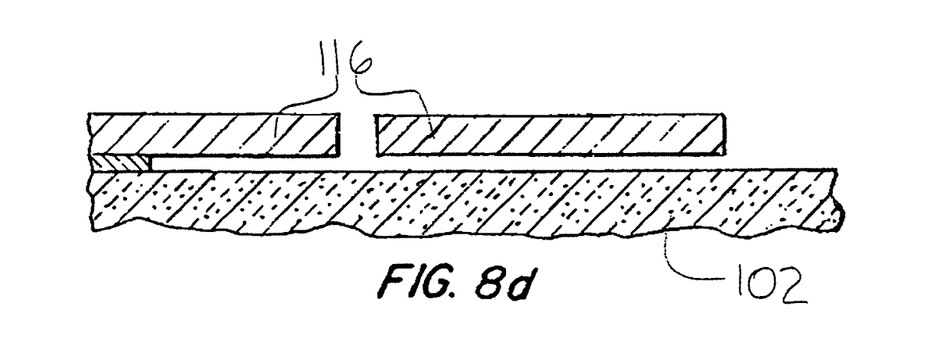

The process is further illustrated in FIGS. 8A-8D showing removal of a polymer 104 from under device elements with high length to width ratios. Here the isotropic removal of the hot gas process will fully remove the polymer 104 from under device elements 116. Following the same procedure as described above, multiple levels of air structures may be made by building up multiple layers of supporting polymer 104. The supporting polymer layers may then be removed in a single hot gas polymer removal process, where FIG. 8B illustrates a partial removal of the polymer 104. FIG. 8C illustrates a further removal of the polymer 104. Finally, FIG. 8D illustrates a complete removal of polymer 104. It should be noted that FIGS. 8A-8D are cross-sectional views and that that device elements 116 are supported elsewhere not shown in the Figures.

Figure 9A:
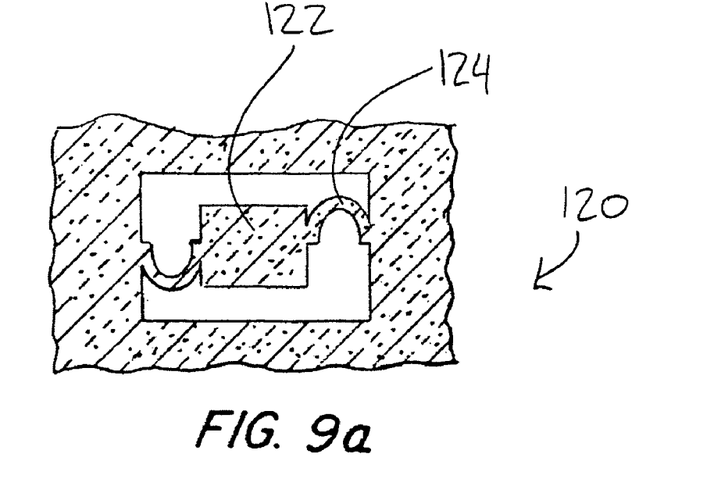
FIG. 9A is a top view of a MEMS spring and block structure.
Figure 9B:
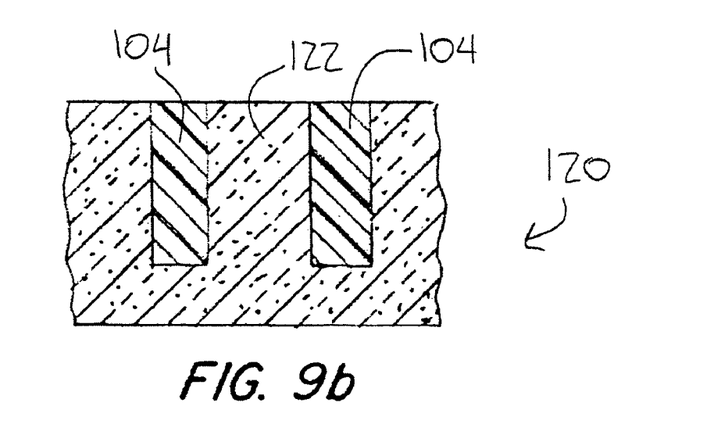
FIGS. 9B-9C are cross-sectional views according to FIG. 9A illustrating how the removable polymer protects free structures during manufacture.
Figure 9C:
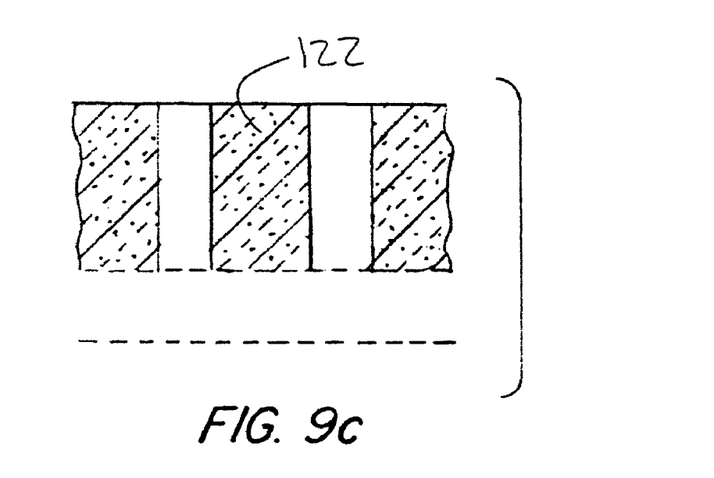

The example of FIGS. 9A-9C show an application in which a relatively fragile device 120 needs to be protected from damage in subsequent fabrication steps. This example is a silicon block 122 suspended by silicon springs 124. The block 122 and springs 124 may be formed for example, in a silicon wafer with a single etch step by etching through a photo-lithographically defined mask pattern. This MEMS device 120 could have application to for instance, a micro-accelerometer sensor. A problem is how to protect the relatively fragile springs 122 during subsequent etching and deposition steps that add the additional pattern elements to complete the device 120. Also, the block 122 and spring 124 pattern would likely not be etched though the silicon wafer, as shown in FIG. 9B. Rather, the silicon below the etched area must be removed to leave the free standing block 122 without damaging the spring elements 124. This protection may be provided by filling the open area around the silicon block 122 with a polymer 104 and then removing the polymer 104 by hot gas removal after possible damaging steps are completed, shown in FIGS. 9B and 9C. It is further contemplated that other device elements could be added before removing the polymer 104.

Having thus described the hot gas process and a means of using an atmospheric plasma for generating the required hot gas stream to remove a polymer from a substrate device, the various advantages of the invention can be understood. Variations from the described process can be made by one skilled in the art without departing from the scope of the invention as set forth by the following claims.

What is claimed is:

1. A method for making micro-structures in a substrate comprising the steps of:
   using a polymer to protect or support the micro-structures during fabrication; and
   removing the polymer after completion of fabrication by generating and directing a hot gas stream at the substrate containing the micro-structure devices;
   wherein the hot gas stream defines an etching area over the substrate and further including the step of moving the substrate along a selected path with respect to the removal area to control a partial depth removal of the polymer across the substrate.

2. The method according to claim 1 further comprising the steps of passing the hot gas stream over the substrate multiple times to substantially remove the polymer.

3. The method according to claim 1 wherein the polymer comprises a highly cross-linked polymer for high temperature applications.

4. The method according to claim 3 wherein the highly cross-linked polymer comprises polyimide.

5. The method according to claim 1 wherein the polymer comprises a photoresist.

6. The method according to claim 1 wherein the micro-structures comprise air structures.

7. The method according to claim 6 wherein the air structures comprise multiple levels.

8. The method according to claim 6 wherein the air structures include device elements connected by supports to a conductive connecting element.

9. The method according to claim 6 wherein the air structures comprise copper.

10. The method according to claim 1 wherein the substrate comprises a single crystal material.

11. The method according to claim 1 wherein the substrate comprises single crystal silicon.

12. The method according to claim 1 wherein the hot gas stream is generated in a temperature range between about 4,000° C. and 12,000° C.

13. The method according to claim 1 wherein the hot gas stream is generated in a temperature range between about 7,000° C. and 10,000° C.

14. The method according to claim 1 wherein said step of generating the hot gas stream comprises the steps of generating an atmospheric arc type plasma between an anode and cathode to form a directed hot gas stream.

15. The method according to claim 1 wherein a gas is injected directly into the hot gas stream that is directed at the substrate.

16. The method for removing polymer as in claim 1 wherein the substrate is moved through the hot gas stream at a selected speed and a selected number of passes to remove a desired amount of polymer from the substrate.

17. A substrate having micro-structures manufactured according to the following method:
   using a polymer to protect or support the micro-structures during fabrication; and
   removing the polymer after completion of fabrication by generating and directing a hot gas stream at the substrate containing the micro-structure devices;
   wherein the hot gas stream defines an etching area over the substrate and further including the step of moving the substrate along a selected path with respect to the removal area to control a partial depth removal of the polymer across the substrate.

18. The substrate manufactured according to the method of claim 17, the method further comprising the steps of passing the hot gas stream over the substrate multiple times to substantially remove the polymer.

19. The substrate manufactured according to the method of claim 17 wherein the polymer comprises polyimide.

20. The substrate manufactured according to the method of claim 17 wherein the polymer comprises a photoresist.

21. The substrate manufactured according to the method of claim 17 wherein the micro-structures comprise air structures.

22. The substrate manufactured according to the method of claim 21 wherein the air structures comprise multiple levels.

23. The substrate manufactured according to the method of claim 21 wherein the air structures include device elements connected by supports to a conductive connecting element.

24. The substrate manufactured according to the method of claim 17 wherein the substrate comprises a single crystal material.

25. The substrate manufactured according to the method of claim 17 wherein the hot gas stream is generated in a temperature range between about 4,000° C. and 12,000° C.

26. The substrate manufactured according to the method of claim 17 wherein said step of generating the hot gas stream comprises the steps of generating an atmospheric arc type plasma between an anode and cathode to form a directed hot gas stream.

27. The substrate manufactured according to the method of claim 17 wherein a gas is injected directly into the hot gas stream that is directed at the substrate.

28. The substrate manufactured according to the method of claim 17 wherein the substrate is moved through the hot gas stream at a selected speed and a selected number of passes to remove a desired amount of polymer from the substrate.

* * * * *